United States Patent [19]

Hayakawa et al.

[11] Patent Number: 4,905,246

[45] Date of Patent: Feb. 27, 1990

[54] SEMICONDUCTOR LASER DEVICE

[75] Inventors: Toshiro Hayakawa, Yokohama; Takahiro Suyama, Tenri; Kosei Takahashi, Nara; Masafumi Kondo, Tenri, all of Japan

[73] Assignee: Sharp Kabushiki Kaisha, Osaka, Japan

[21] Appl. No.: 291,124

[22] Filed: Dec. 28, 1988

[30] Foreign Application Priority Data

Dec. 29, 1987 [JP] Japan .................................. 62-332707

[51] Int. Cl.$^4$ .............................................. H01S 3/19
[52] U.S. Cl. ........................................ 372/45; 357/4; 357/16; 357/17
[58] Field of Search ................. 372/43, 45, 46; 357/4, 357/17, 16

[56] References Cited

U.S. PATENT DOCUMENTS

| 4,745,612 | 5/1988 | Hayakawa et al. ................... 372/45 |
| 4,750,183 | 6/1988 | Takahashi et al. ................... 372/45 |
| 4,787,089 | 11/1988 | Hayakawa et al. ................... 372/45 |

FOREIGN PATENT DOCUMENTS 136839 10/1985 European Pat. Off. .
0166593 1/1986 European Pat. Off. .

OTHER PUBLICATIONS

Lindstrom et al., (1983), Applied Physics Letters, 42(2):134–136.
Tokuda et al., (1986), Journal of Applied Physics, 60(8):2729–2734.
Blood et al., (1985), Applied Physics Letters, 47(3):193–195.
Patent Abstracts of Japan, (Jul. 28, 1987), vol. 11, No. 231, E-527, 2678.
K. Hamada et al., IEEE Journal of Quantum Electronics, vol. QE-21, No. 6, pp. 623–628, (1985).
T. Murakami et al., IEEE Journal of Quantum Electronics, vol. QE-23, pp. 712–719, (1987).
D. R. Scifres et al., Applied Physics Letters, vol. 41, pp. 1030–1032, (1982).
D. R. Scifres et al., Electronics Letters, vol. 19, pp. 169–171, (1983).
W. T. Tsang, Applied Physics Letters, vol. 39, No. 10, pp. 786–788, (1981).
H. Iwamura, T. Saku, T. Ishibashi, K. Otsuka, Y. Horikoshi, Electronics Letters, vol. 19, No. 5, pp. 180–181, (1983).
K. Hamada et al., IEEE Journal of Quantum Electronics, vol. QE-23, pp. 623–628, (1987).

*Primary Examiner*—William L. Sikes
*Assistant Examiner*—Georgia Y. Epps
*Attorney, Agent, or Firm*—Manella & Irell

[57] ABSTRACT

A semiconductor laser device containing a laser oscillation-operating area which comprises a $Ga_{1-x}Al_xAs$ ($0 \leq x \leq 1$) quantum well active layer, $Ga_{1-y}Al_yAs$ optical guiding layers interposing the quantum well active layer therebetween, and $Ga_{1-z}Al_zAs$ cladding layers superposed on the optical guiding layers, respectively, wherein the AlAs mole fraction y at the area of each of the optical guiding layers positioned in the vicinity of the interface of the optical guiding layers and the quantum well active layer meets the relationships $y - z \geq 0.3$ and $z - y \leq 0.25$.

3 Claims, 4 Drawing Sheets

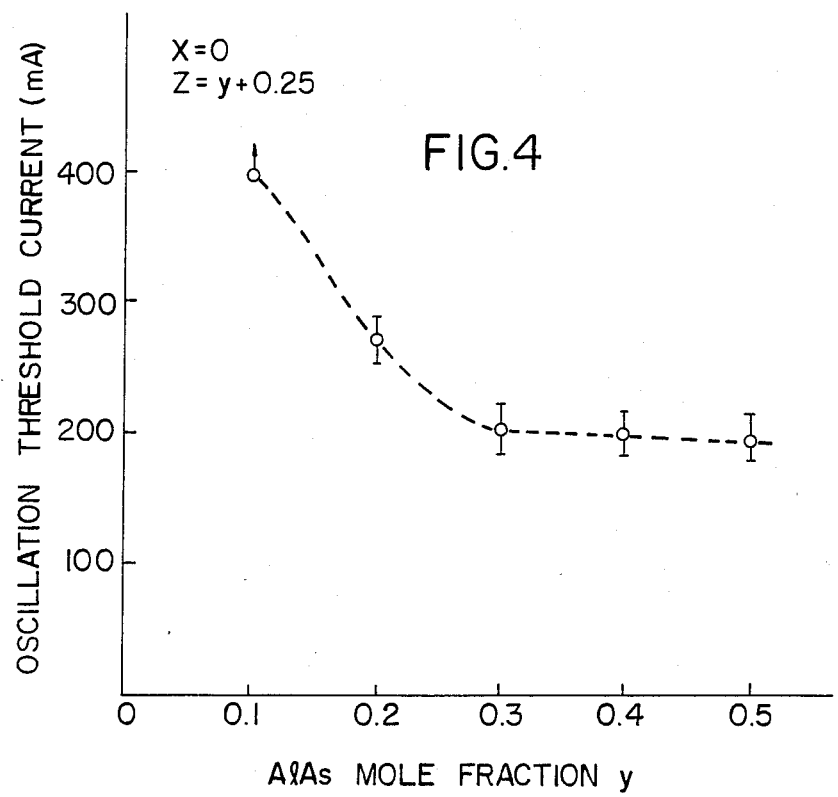
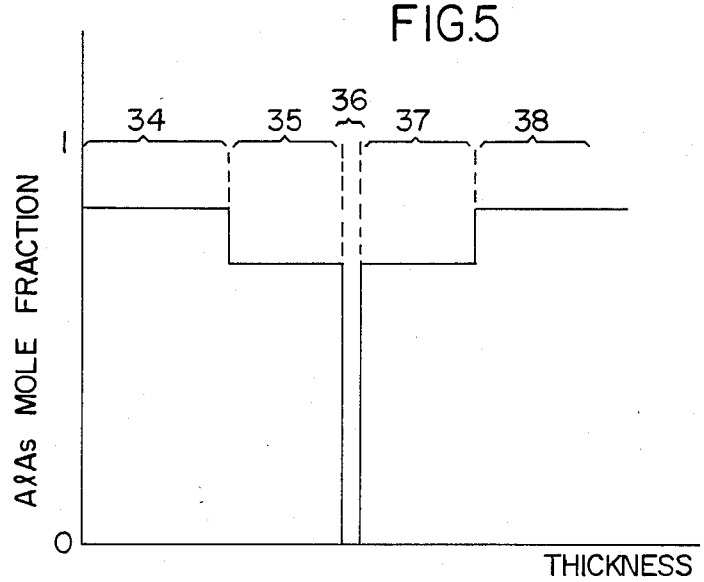

SEMICONDUCTOR LASER DEVICE

BACKGROUND OF THE INVENTION

1. Field of the Invention

This invention relates to a GaAlAs semiconductor laser device, and more particularly, to an improved GaAlAs semiconductor laser device with a quantum well structure.

2. Description of the Prior Art

In recent years, thin single crystal film growth techniques such as molecular beam epitaxy (MBE) and metal organic-chemical vapor deposition (MO-CVD), have been rapidly developed which enables the formation of extremely thin epitaxial growth layers having a thickness of as thin as approximately 10 Å. Due to the progress in these crystal growth techniques, it is possible to make laser devices based on device structures having very thin layers which could not be easily produced by conventional liquid phase epitaxy (LPE). A typical example of these laser devices is a quantum well (QW) laser device, in which the active layer has a thickness of 100 Å or less resulting in the formation of quantum levels therein, whereas the active layer of conventional double-heterostructure (DH) laser devices has a thickness of several hundreds of angstroms or more. Thus, this quantum well laser is advantageous over the conventional double-heterostructure lasers in that the threshold current level is reduced and the transient characteristics are superior. Such quantum well laser devices are described in detail in the following articles:

(1) W. T. Tsang, Applied Physics Letters, vol.39, No. 10, pp.786 (1981); and (2) H. Iwamura, T. Saku, T. Ishibashi, K. Ohtsuka, Y. Horikoshi, Electronics Letters, vol.19, No.5, pp.180 (1983).

As mentioned above, by the use of thin single crystal film growth techniques such as MBE and MO-CVD, it is now possible to put high-performance semiconductor lasers into practical use.

FIG. 6 shows a GaAlAs graded-index separate confinement heterostructure (GRIN-SCH) semiconductor laser device with a single quantum well structure. The AlAs mole fraction in the active region of this semiconductor laser device is shown in FIG. 7. Reference numerals 44 to 48 given in this figure along the abscissa axis indicating the direction of a layer thickness denote the regions corresponding to respective layers of the laser device shown in FIG. 6, respectively. That is, the double-heterostructure of this laser device is composed of a cladding layer 44, a GRIN optical guiding layer 45, a quantum well active layer 46, a GRIN optical guiding layer 47, and a cladding layer 48, which are disposed in the direction of a layer thickness.

The quantum well structure provides a high radiation efficiency based on the quantum effect thereof. However, the thickness of the quantum well active layer is about 100 Å or less, which is smaller than the wavelength of laser light by one order or more of magnitude, so that the active layer cannot confine the laser light. On the other hand, semiconductor laser devices must give rise to induced emission, and the gains thereof are proportional to the density of photons within the quantum well. Therefore, in the GRIN-SCH structure, laser light is guided through the GRIN optical guiding layers 45 and 47 with a gradient of the AlAs mole fraction, which are superposed on the quantum well active layer 46, respectively, resulting in enhanced efficiency of the interaction between the carriers within the quantum well and the laser light.

However, in the GRIN-SCH semiconductor laser device with a single quantum well structure, the first and second GRIN optical guiding layers 45 and 47 have a thickness of about 1500 to 2000 Å, whereas the thickness of the quantum well active layer 46 is quite small to the order of 100 Å or less. Therefore, in the conventional double-heterostructure laser device, 20 to 30% or more of laser light is confined within the active layer, whereas the GRIN-SCH semiconductor laser device with a single quantum well structure has a coefficient $\Gamma$ of confinement of laser light within the quantum well active layer of 10 to 5% or less, which is quite small as compared with the double-heterostructure laser device.

As mentioned above, the GRIN-SCH semiconductor laser device with a single quantum well structure has gains enhanced by the quantum effect despite its small coefficient $\Gamma$ of confinement, and it is possible to reduce the threshold current density, which is 500 A/cm$^2$ or more for the conventional double-heterostructure laser device, to 200 A/cm$^2$ or less. Such a decrease in the threshold current density can also be attained in a SCH semiconductor laser device with a quantum well structure comprising optical guiding layers with a constant AlAs mole fraction.

On the other hand, the double-heterostructure laser device usually has a thin active layer to attain high output power. The improvement in output power by making the active layer thin is disclosed by, for example, K. Hamada et al., IEEE Journal of Quantum Electronics, vol. QE-21, pp.623 (1985) and T. Murakami et al., IEEE Journal of Quantum Electronics, vol. QE-23, pp.712 (1987).

However, when the active layer has a thickness of about 1000 Å or less, the amount of laser light transmitted to the cladding layer increases, resulting in a decrease in the coefficient $\Gamma$ of confinement. Therefore, when the thickness of the active layer is about 500 Å or less, as the active layer becomes thinner, the ratio of the recombination region decreases, resulting in an increase in the threshold current. However, because of a decrease in the density of photons within the active layer, it is possible to raise a maximum optical output power level which causes a disruption of the facets of a laser device. Based on such an idea, as semiconductor laser devices with an improved device structure in which the coefficient $\Gamma$ of confinement is further reduced and which does not need an increase in the threshold current, there can be mentioned a GRIN-SCH and a SCH semiconductor laser devices with a quantum well structure. These laser devices are used as those for superhigh output power; see, for example, D. R. Scifres et al., Applied Physics Letters, vol.41, pp.1030 (1982) and D. R. Scifres et al., Electronics Letters, vol.19, pp.169 (1983).

The inventors have investigated quantum well laser devices, and found that the upper limit of optical output power of these laser devices is not determined by the coefficient $\Gamma$ of confinement.

The GRIN-SCH semiconductor laser devices with a single quantum well structure shown in FIG. 7 was produced as follows: On the (100) plane of a Si-doped n-GaAs substrate (Si=2$\times$10$^{18}$ cm$^{-3}$) 41, a Si-doped n-GaAs buffer layer (Si=1$\times$10$^{18}$ cm$^{-3}$; the thickness thereof being 0.5 μm) 42, a Si-doped n-Ga$_{1-y}$Al$_y$As graded buffer layer (Si=1$\times$10$^{18}$ cm$^{-3}$; the thickness thereof being 0.2 μm) 43, a Si-doped n-Ga$_{0.3}$Al$_{0.7}$As cladding layer (Si=1×10$^{18}$ cm$^{-3}$; the thickness thereof being 1.4 μm) 44, an undoped GaAlAs GRIN layer (the thickness thereof being 0.15 μm) 45, an undoped GaAs quantum well active layer 46, an undoped GaAlAs GRIN layer (the thickness thereof being 0.15 μm) 47, a Be-doped p-Ga$_{0.3}$Al$_{0.7}$As cladding layer (Be32 5×10$^{17}$ cm$^{-3}$; the thickness thereof being 1 μm) 48, a Be-doped p-GaAs cap layer (Be=2×10$^{18}$ cm$^{-3}$; the thickness thereof being 0.2 μm) 49, a Si-doped n-Ga$_{0.5}$Al$_{0.5}$As current blocking layer (Si=1×10$^{18}$ cm$^{-3}$; the thickness thereof being 0.6 μm ) 50, and a Si-doped n-GaAs contact layer (Si=1×10$^{18}$ cm$^{-3}$; the thickness thereof being 0.2 μm) 51 were successively grown by molecular beam epitaxy. The temperature of the substrate was set to be 720° C. during the growth and the flux ratio of group V to group III was about 2.5.

After the growth, the central portion of each of the contact layer 51 and the current blocking layer 50 was selectively removed into a striped shape having a width of 100 μm by an etching technique using an H$_2$SO$_4$ etchant and an HF etchant. Then, an n-sided electrode 52 of AuGe/Ni/Au and a p-sided electrode 53 of AuZn/Au were disposed on the back face of the substrate 41 and the upper face of the contact layer 51 including the cap layer 49 and the current blocking layer 50, respectively, by the vacuum evaporation method.

The AlAs mole fraction v in the n-Ga$_{1-v}$Al$_v$As graded buffer layer 43 was changed in the range of 0.1 to 0.7 according to the linear distribution. Moreover, the AlAs mole fractions in the undoped GaAlAs GRIN layer 45 and 47 were changed in the range of 0.7 to 0.2 and in the range of 0.2 to 0.7, respectively, according to the parabolic distribution.

The thickness Lz of the quantum well active layer 46 was set to different values in the range of 40 to 300 Å, and various semiconductor laser devices with different thickness Lz were produced in the same manner as mentioned above.

The wafer obtained was then cleaved to form a laser device unit with a cavity length of 375 μm. The facets on both sides of the laser device were coated with an Al$_2$O$_3$ film and a multi-layered film made of Al$_2$O$_3$ and Si, respectively, by the electron beam deposition method, so that the reflective indices of these coated facets were about 5 and 90%, respectively. The unit was then mounted on a copper heat sink by means of a soldering material such as In, resulting in a semiconductor laser device of FIG. 6.

The resulting semiconductor laser device oscillated a laser beam at a threshold current of 150 to 300 mA when driven with a direct current. At that time, the optical output power level of a laser beam emitted from the front facet having a reflective index of 5% was monitored, and it was found that the disruptive power level is almost constant at 1.2 ±0.1 W when the thickness Lz of the active layer 46 is in the range of 40 to 200 Å, but decreases slightly to 1 W or less when the thickness Lz equals to 300 Å.

The coefficient Γ of confinement of laser light within the quantum well of these laser devices is nearly given by (Lz/3000)×100% (where the thickness Lz is in Å). Therefore, even when the thickness Lz is in the range of 40 to 200 Å at which the upper limit of the disruptive power level is almost constant, the coefficient Γ of confinement varies greatly in the range of 1.3 to 7%. In this way, it was found that because the GRIN-SCH semiconductor laser device with a quantum well structure has the coefficient Γ of confinement quite smaller than that of the conventional double-heterostructure laser device, the upper limit of optical output power of the GRIN-SCH semiconductor laser device is not determined by the coefficient Γ of confinement. This fact also holds in the case of the SCH semiconductor laser device with a quantum well structure which has a coefficient Γ of confinement of 10%.

SUMMARY OF THE INVENTION

The semiconductor laser device of this invention, which overcomes the above-discussed and numerous other disadvantages and deficiencies of the prior art, contains a laser oscillation-operating area which comprises a Ga$_{1-x}$Al$_x$As (0≦x≦1) quantum well active layer, Ga$_{1-y}$Al$_y$As optical guiding layers interposing the quantum well active layer therebetween, and Ga$_{1-z}$Al$_z$As cladding layers superposed on the optical guiding layers, respectively, wherein the AlAs mole fraction y at the area of each of the optical guiding layers positioned in the vicinity of the interface of the optical guiding layers and the quantum well active layer meets the relationships y−x≧0.3 and z−y≦0.25.

In a preferred embodiment, the whole area of each of the optical guiding layers is constituted by a GRIN region, the AlAs mole fraction of which varies according to the paraboric distribution.

In a preferred embodiment, the AlAs mole fraction y of each of the optical guiding layers is constant in the direction of a layer thickness.

Thus, the invention described herein makes possible the objectives of (1) providing a semiconductor laser device in which the confinement of laser light is reduced without excessive loss of low threshold current characteristics, so that the peak intensity of laser light can be decreased, thereby attaining a substantial improvement in the upper limit of optical output power; and (2) providing a semiconductor laser device in which the maximum optical output power level is raised by modifying the structure of a conventional GRIN-SCH or SCH quantum well laser device.

BRIEF DESCRIPTION OF THE DRAWINGS

This invention may be better understood and its numerous objects and advantages will become apparent to those skilled in the art by reference to the accompanying drawings as follows:

FIG. 4 is a graph showing the relationship between the AlAs mole fraction (i.e., y) at the area of each of Ga$_{1-y}$Al$_y$As optical guiding layers positioned in the vicinity of the interface of the optical guiding layers and the quantum well active layer, and the oscillation threshold current of the semiconductor laser device shown in FIG. 1.

FIG. 5 is a graph showing the AlAs mole fraction in the active region of another semiconductor laser device of this invention.

DESCRIPTION OF THE PREFERRED EMBODIMENTS

This invention provides a semiconductor laser device in which the difference in the AlAs mole fraction between the optical guiding layers and the cladding layers is decreased to reduce the confinement of laser light in the direction of a layer thickness, so that the peak intensity of laser light can be decreased, thereby attaining a substantial improvement in the maximum optical output power level; and in which the difference in the AlAs mole fraction at the interface of the quantum well layer and the optical guiding layers in contact therewith is increased to prevent a rise in the threshold current, so that the height of a heterobarrier of the quantum well can be increased, thereby attaining a large quantum effect. Thus, the semiconductor laser device of this invention can oscillate a laser beam of higher output power without a substantial increase in the threshold current.

EXAMPLE 1

Figure 1:
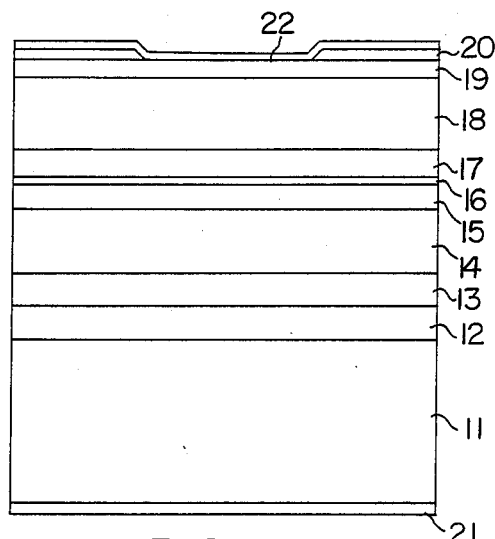
FIG. 1 is a front sectional view showing a semiconductor laser device of this invention.

FIG. 1 shows a GRIN-SCH (graded-index separate confinement heterostructure) semiconductor laser device of this invention, which was produced as follows: On the (100) plane of a Si-doped n-GaAs substrate (Si=$2\times 10^{18}$ cm$^{-3}$) 11, a Si-doped n-GaAs buffer layer (Si=$1\times 10^{18}$ cm$^{-3}$; the thickness thereof being 0.5 μm) 12, a Si-doped n-Ga$_{1-w}$Al$_w$As graded buffer layer (Si=$1\times 10^{18}$ cm$^{-3}$; the thickness thereof being 0.2 μm) 13, a Si-doped n-Al$_z$Ga$_{1-z}$As cladding layer (Si=$1\times 10^{18}$ cm$^{-3}$; the thickness thereof being 1.4 μm) 14, an undoped Ga$_{1-y}$Al$_y$As GRIN optical guide layer (the thickness thereof being 0.15 μm) 15, an undoped Ga$_{1-x}$Al$_x$As quantum well active layer (the thickness thereof being 60 Å) 16, an undoped Ga$_{1-y}$Al$_y$As GRIN optical guide layer (the thickness thereof being 0.15 μm) 17, a Be-doped p-Ga$_{1-z}$Al$_z$As cladding layer (Be=$5\times 10^{17}$ cm$^{-3}$; the thickness thereof being 1 μm) 18, and a Be-doped p-GaAs cap layer (Be=$2\times 10^{18}$ cm$^{-3}$; the thickness thereof being 0.2 μm) 19 were successively grown by molecular beam epitaxy.

Then, by plasma-activated chemical vapor deposition, a SiN$_x$ film 20 with a thickness of 2000 Å was formed on top of the cap layer 19, and by photolithography and chemical etching techniques, the SiN$_x$ film was selectively removed in a stripe form with a width of 100 μm. Thereafter, an n-sided electrode 21 of AuGe/Ni/Au and a p-sided electrode 22 of AuZn/Au were formed on the back face of the n-substrate 11 and the upper face of the SiN$_x$ film 20 including the cap layer 19, respectively, by the vacuum evaporation method.

The wafer obtained was then cleaved to form a laser device unit with a cavity length of 375 μm. The facets on both sides of the laser device were coated with a film having a reflective index of 5% and a film having a reflective index of 90%, respectively. The unit was then mounted on a copper heat sink by means of a soldering material such as In, resulting in a semiconductor laser device of this invention.

The AlAs mole fraction x, y, and z in the respective GaAlAs layers were set to different values as mentioned below, and various semiconductor laser devices with different AlAs mole fractions were produced in the same manner as mentioned above.

Figure 2:
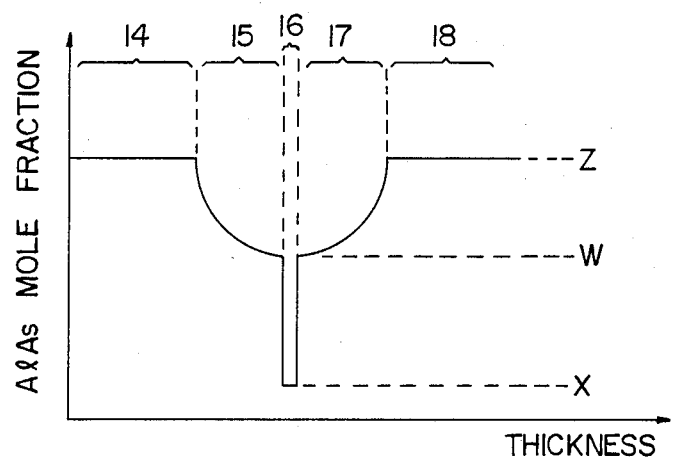
FIG. 2 is a graph showing the AlAs mole fraction in the active region of the semiconductor laser device shown in FIG. 1.
Figure 3:
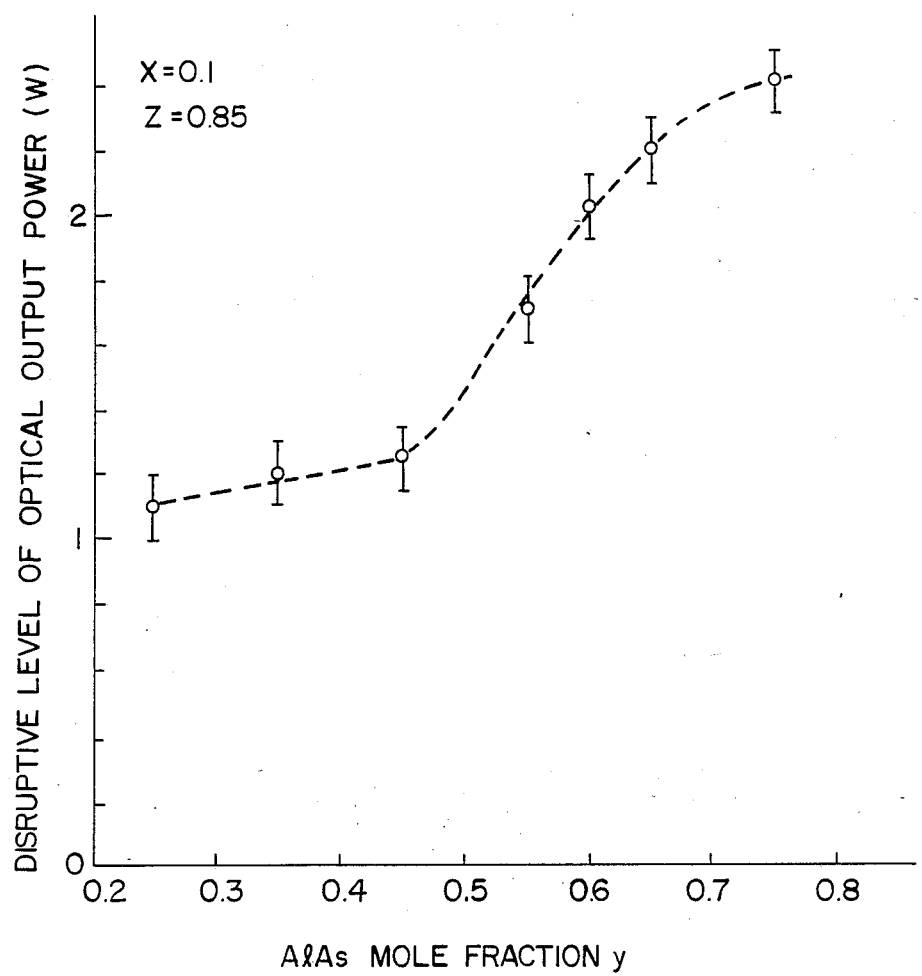
FIG. 3 is a graph showing the relationship between the AlAs mole fraction (i.e., y) at the area of each of Ga$_{1-y}$Al$_y$As optical guiding layers positioned in the vicinity of the interface of the optical guiding layers and the quantum well active layer, and the disruptive level of optical output power of the semiconductor laser device shown in FIG. 1.
Figure 6:
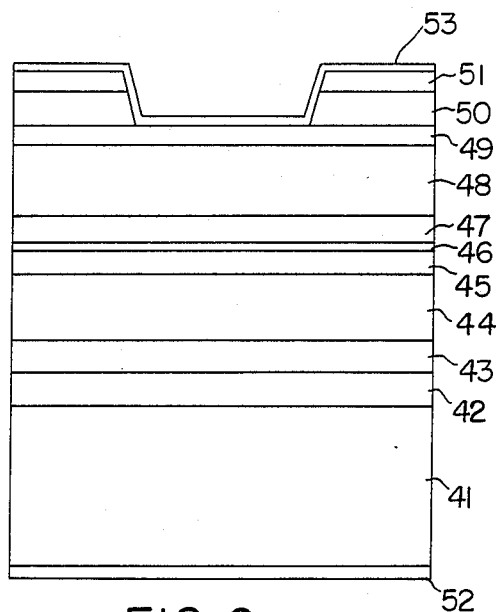
FIG. 6 is a front sectional view showing a conventional semiconductor laser device.
Figure 7:
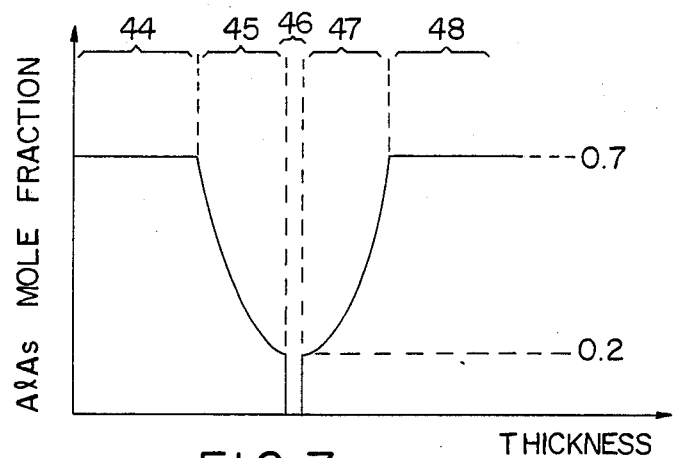
FIG. 7 is a graph showing the AlAs mole fraction in the active region of the semiconductor laser device shown in FIG. 6.

First, the AlAs mole fractions x in the quantum well active layer 16 and z in each of the cladding layers 14 and 18 were set to be constant at 0.1 and 0.85, respectively, and the AlAs mole fraction y at the area of each of the GRIN optical guiding layers 15 and 17 positioned in the vicinity of the interface of these optical guiding layers and the quantum well active layer 16 (this value of y is indicated by "w" in FIG. 2), was varied from 0.25 to 0.75, resulting in a variety of semiconductor laser devices. The dependence of the upper limit of optical output power, at which the facets of these laser devices would be disrupted, on the AlAs mole fraction y was measured, and it was found that semiconductor laser devices with the AlAs mole fraction y≧0.6 can attain the disruptive level of optical output power of 2 W or more as shown in FIG. 3.

Thus, when the AlAs mole fractions y and z are set to meet the relationship z−y≦0.25, the confinement of laser light is reduced, so that the peak intensity of laser light can be decreased.

Next, the AlAs mole fractions y and z were set to be constant at 0.6 and 0.85, respectively, and only the AlAs mole fraction x in the quantum well active layer 16 was varied from zero to 0.15, resulting in semiconductor laser devices which attained a maximum optical output power of 2 W or more. Thus, by setting the AlAs mole fractions y and z to meet the relationship z−y≦0.25, the confinement of laser light was reduced, so that the peak intensity of laser light was decreased, thereby attaining a substantial improvement in the maximum optical output power level.

On the other hand, the AlAs mole fraction x in the quantum well active layer 16 was set to be zero (that is, the quantum well active layer 16 is made of GaAs), and the AlAs mole fraction y at the area of each of the GRIN optical guiding layers 15 and 17 positioned in the vicinity of the interface of these optical guiding layers and the quantum well active layer 16 (this value of y is defined as w), was varied from 0.1 to 0.5. At that time, the AlAs mole fraction z in each of the cladding layers 14 and 18 was varied in such a range as to meet both the condition which allowed the maximum output power of 2 W or more in the above-described experiment and the relationship z=y+0.25 so that the distribution of laser light could not be changed. As a result, as shown in FIG. 4, the threshold current rapidly increased when the difference y−x in the AlAs mole fractions, which gives rise to a quantum well, was 0.3 or less. Therefore, it is necessary for the AlAs mole fractions x and y to meet the relationship y−x≧0.3. The reason why the threshold current increases when y−x<0.3 is that the heterobarrier in the quantum well active layer 16 becomes low, resulting in the disappearance of the quantum effect.

As seen from the results of the above-described experiments, the semiconductor laser device of this invention in which the AlAs mole fractions x, y, and z meet the relationships z−y≦0.25 and y−x ≧0.3 can attain the disruptive level of optical output power of 2 W or more and can stably oscillate a laser beam of high power at a threshold current of about 200 mA.

EXAMPLE 2

FIG. 5 shows the AlAs mole fraction in the active region of a SCH semiconductor laser device of this invention, which was produced as follows: On the plane of a Si-doped n-GaAs substrate (Si=$2\times10^{18}$ cm$^{-3}$) that is inclined toward the (100) plane at an angle of 0.5 degrees to the (111) B plane, a Si-doped n-GaAs buffer layer (Si=$2\times10^{18}$ cm$^{31}$ $^3$; the thickness thereof being 0.5 μm), a Si-doped n-Ga$_{1-w}$Al$_w$As graded buffer layer (Si=$1\times10^{18}$ cm$^{-3}$; the thickness thereof being 0.2 μm), a Si-doped n-Ga$_{0.15}$Al$_{0.85}$As cladding layer (Si=$1\times10^{18}$ cm$^{-3}$; the thickness thereof being 1.4 μm) 34, an undoped Ga$_{0.3}$Al$_{0.7}$As optical guiding layer (the thickness thereof being 0.15 μm) 35, an undoped GaAs quantum well active layer (the thickness thereof being 60 Å) 36, an undoped Ga$_{0.3}$Al$_{0.7}$As optical guiding layer (the thickness thereof being 0.15 μm) 37, a Be-doped p-Ga$_{0.15}$Al$_{0.85}$As cladding layer (Be=$5\times10^{17}$ cm$^{-3}$; the thickness thereof being 1 μm) 38, and a Be-doped p-GaAs cap layer (Be=$2\times10^{18}$ cm$^{-3}$; the thickness thereof being 0.2 μm) were successively grown by molecular beam epitaxy. Then, on the wafer obtained in this way, semiconductor laser devices with a striped structure having a width of 100 μm, which is formed by the use of a SiN$_x$ film, were produced, and the facets on both sides of these laser devices were coated with a film having a reflective index of 5% and a film having a reflective index of 90%, respectively, in the same way as those of Example 1.

The AlAs mole fractions x, y, and z in the respective GaAlAs layers were varied in the same manner as described in Example 1, resulting in a variety of semiconductor laser devices with different AlAs mole fractions. After the semiconductor laser device was mounted on a copper heat sink, the threshold current thereof was measured. This measurement confirmed that when the AlAs mole fractions x, y, and z meet the claimed relationships, $y-x\geq0.3$ and $z-y\leq0.25$, the semiconductor laser device of this invention can oscillate a laser beam at a threshold current of 160 to 200 mA and can attain the disruptive level of optical output power of 2.2 to 2.4 W.

Although the above-mentioned examples disclose only semiconductor laser devices with a striped structure, this invention is directed to a semiconductor laser device in which the confinement of laser light in the direction of a layer thickness is lowered, so that oscillating operation can be attained at high power without a substantial increase in the threshold current density. Therefore, this invention is, of course, applicable to any semiconductor laser device with a striped structure including a semiconductor laser device with a ridge waveguide structure and a semiconductor laser device with a buried structure.

Moreover, the thickness of an active layer is not limited to those disclosed in Examples 1 and 2, but any active layer with a thickness being the de Briglie's wavelength or less can be used to attain the quantum effect.

This invention is also applicable to a semiconductor laser device with a multi-layered striped structure, so that the output power level can be further increased.

Moreover, if the semiconductor laser device of this invention is provided with a window structure in which Zn or Si diffusion regions are disposed in the vicinity of the facets of the laser device, so that the quantum well is buried in the laser device, the output power level can be still further increased.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device containing a laser oscillation-operating area which comprises a Ga$_{1-x}$Al$_x$As ($0\leq x\leq 1$) quantum well active layer, Ga$_{1-y}$Al$_y$As optical guiding layers interposing said quantum well active layer therebetween, and Ga$_{1-z}$Al$_z$As cladding layers superposed on said optical guiding layers, respectively, the improvement wherein the AlAs mole fraction y at the area of each of said optical guiding layers positioned adjacent the interface of the optical guiding layers and the quantum well active layer meets the relationships $y-x\geq0.3$ and $z-y\leq\leq0.25$.

2. A semiconductor laser device according to claim 1, wherein the whole area of each of said optical guiding layers is constituted by a GRIN region, the AlAs mole fraction of which varies according to the paraboric distribution.

3. A semiconductor laser device according to claim 1, wherein the AlAs mole fraction y of each of said optical guiding layers is constant in the direction of a layer thickness.

* * * * *